United States Patent
Kitamoto et al.

(10) Patent No.: US 10,505,363 B2
(45) Date of Patent: Dec. 10, 2019

(54) OVERCURRENT PROTECTION CIRCUIT

(71) Applicant: JTEKT CORPORATION, Osaka-shi, Osaka (JP)

(72) Inventors: Hiroshi Kitamoto, Toyota (JP); Nobuhiro Uchida, Yamatotakada (JP)

(73) Assignee: JTEKT CORPORATION, Osaka (JP)

( * ) Notice: Subject to any disclaimer, the term of this patent is extended or adjusted under 35 U.S.C. 154(b) by 270 days.

(21) Appl. No.: 15/621,447

(22) Filed: Jun. 13, 2017

(65) Prior Publication Data
US 2017/0365997 A1   Dec. 21, 2017

(30) Foreign Application Priority Data
Jun. 20, 2016   (JP) ................................. 2016-121959

(51) Int. Cl.
*H02G 9/00* (2006.01)
*H02H 9/02* (2006.01)
(Continued)

(52) U.S. Cl.
CPC .............. *H02H 9/02* (2013.01); *H02H 3/006* (2013.01); *H02H 3/08* (2013.01); *H02H 5/041* (2013.01);
(Continued)

(58) Field of Classification Search
CPC ............ H02H 9/02; H02H 3/006; H02H 3/08; H02H 5/041; H02M 1/32; H03K 17/08; H03K 17/0822; H03K 17/082
See application file for complete search history.

(56) References Cited

U.S. PATENT DOCUMENTS

| 5,719,519 A * | 2/1998 | Berringer .......... H02M 7/53875 327/423 |
| 2003/0117753 A1* | 6/2003 | Kato .................... H02H 7/1225 361/18 |

(Continued)

FOREIGN PATENT DOCUMENTS

| CN | 103190048 A | 7/2013 |
| CN | 104280628 A | 1/2015 |

(Continued)

OTHER PUBLICATIONS

Nov. 7, 2017 Extended Search Report issued in European Patent Application No. 17175970.7.
Sep. 27, 2019 Office Action issued in Chinese Patent Application No. 201710469395.3.

*Primary Examiner* — Pete T Lee
(74) *Attorney, Agent, or Firm* — Oliff PLC

(57) ABSTRACT

An overcurrent protection circuit includes an amplifier configured to amplify an inter-terminal voltage of a shunt resistor, an offset application circuit configured to allow the amplifier to provide an output with a predetermined offset voltage additionally applied thereto, a first comparator that compares an output voltage from the amplifier with a predetermined first reference voltage higher than the offset voltage to output a through-current sensing signal when the output voltage from the amplifier is higher than a first reference voltage, and an amplifier failure determination circuit that compares the output voltage from the amplifier with a predetermined second reference voltage that is higher than zero and lower than the offset voltage to output an amplification circuit failure determination signal corresponding to a result of the comparison.

3 Claims, 2 Drawing Sheets

(51) Int. Cl.
  *H02H 3/00* (2006.01)
  *H02H 3/08* (2006.01)
  *H02H 5/04* (2006.01)
  *H02M 1/32* (2007.01)
  *H03K 17/08* (2006.01)
  *H03K 17/082* (2006.01)

(52) U.S. Cl.
  CPC .............. *H02M 1/32* (2013.01); *H03K 17/08* (2013.01); *H03K 17/0822* (2013.01); *H03K 17/0828* (2013.01)

(56) References Cited

U.S. PATENT DOCUMENTS

| | | |
|---|---|---|
| 2007/0124029 A1 | 5/2007 | Hattori et al. |
| 2009/0135531 A1* | 5/2009 | Hirata .................... H02H 3/093 361/18 |
| 2009/0243626 A1* | 10/2009 | Maeda .................. H03F 1/0288 324/537 |
| 2012/0176117 A1 | 7/2012 | Watanabe et al. |
| 2013/0223114 A1 | 8/2013 | Nakayama et al. |
| 2015/0008935 A1 | 1/2015 | Choi et al. |

FOREIGN PATENT DOCUMENTS

| | | |
|---|---|---|
| JP | 2007074794 A | 3/2007 |
| JP | 2010-119298 A | 5/2010 |
| WO | 2007/124029 A2 | 11/2007 |

\* cited by examiner

OVERCURRENT PROTECTION CIRCUIT

INCORPORATION BY REFERENCE

The disclosure of Japanese Patent Application No. 2016-121959 filed on Jun. 20, 2016 including the specification, drawings and abstract, is incorporated herein by reference in its entirety.

BACKGROUND OF THE INVENTION

1. Field of the Invention

The invention relates to an overcurrent protection circuit used for an electronic circuit having at least one series circuit of an upper switching element and a lower switching element.

2. Description of the Related Art

In an electronic circuit such as an inverter circuit which includes a series circuit of an upper switching element and a lower switching element, the switching elements or the electronic circuit may fail, leading to a short circuit between the upper switching element and the lower switching element. When such a short circuit occurs, a through-current flows from a power supply through the upper switching element and the lower switching element to ground. When an excessive through-current flows through the switching elements, the switching elements may be destroyed.

Japanese Patent Application Publication No. 2007-74794 (JP 2007-74794 A) discloses an overcurrent protection circuit that controllably turns off switching elements when a current with a predetermined value or larger continuously flows through the switching elements for a predetermined period of time. Specifically, the overcurrent protection circuit includes a first comparator that outputs an H-level signal when an inter-terminal voltage of a shunt resistor is higher than a first predetermined value, a switch that is turned on when the H-level signal is output from the first comparator, a capacitor that is charged by a constant current source while the switch is on, and a second comparator that outputs a signal intended to turn off the switching elements when an inter-terminal voltage of the capacitor is higher than a second predetermined value. The first comparator described in JP 2007-74794 A is considered to actually include an amplifier that amplifies the inter-terminal voltage of the shunt resistor and a comparator that compares a reference voltage with a voltage amplified by the amplifier.

In general, for an electronic circuit provided with an overcurrent protection circuit, the overcurrent protection circuit needs to be checked to see if the circuit operates normally when the electronic circuit starts operating. However, the overcurrent protection circuit described in JP 2007-74794 A described above is disadvantageous when, for example, a low fixing failure (a failure in which an amplifier output is fixed to a ground level) occurs in the amplifier included in the first comparator. Even in this case, the output from the amplifier is at an L level while the electronic circuit is in normal operation. Thus, the electronic circuit starts operating with the failure undetected. Then, even if such a failure occurs which causes a through-current to flow through the switching elements after the electronic circuit starts operating, the through-current is precluded from being detected.

SUMMARY OF THE INVENTION

An object of the invention is to provide an overcurrent protection circuit that allows checking of whether or not a low fixing failure has occurred in an amplification circuit configured to amplify an inter-terminal voltage of a shunt resistor for through-current detection.

An overcurrent protection circuit in an aspect of the invention is applied to an electronic circuit including at least one series circuit of an upper switching element and a lower switching element. The overcurrent protection circuit includes an amplification circuit configured to amplify an inter-terminal voltage of a shunt resistor for through-current detection, an offset application circuit connected to an input terminal of the amplification circuit to allow the amplification circuit to provide an output with a predetermined offset voltage additionally applied thereto, a comparison circuit for through-current sensing that compares an output voltage from the amplification circuit with a predetermined first reference voltage higher than the offset voltage to output a through-current sensing signal when the output voltage from the amplification circuit is higher than the first reference voltage, a duration measurement circuit configured to measure a duration for which a through-current sensing signal is output from the comparison circuit for through-current sensing, and an amplification circuit failure determination circuit that compares the output voltage from the amplification circuit with a predetermined second reference voltage that is higher than zero and lower than the offset voltage to output an amplification circuit failure determination signal corresponding to a result of the comparison.

In this configuration, while the electronic circuit is in normal operation, the output voltage from the amplification circuit is higher than the second reference voltage when no low fixing failure has occurred in the amplification circuit, and is lower than the second reference voltage when a low fixing failure has occurred in the amplification circuit. Therefore, the configuration allows checking of whether or not a low fixing failure has occurred in the amplification circuit.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

An embodiment of the invention will be described below in detail with reference to the attached drawings.

Figure 1:
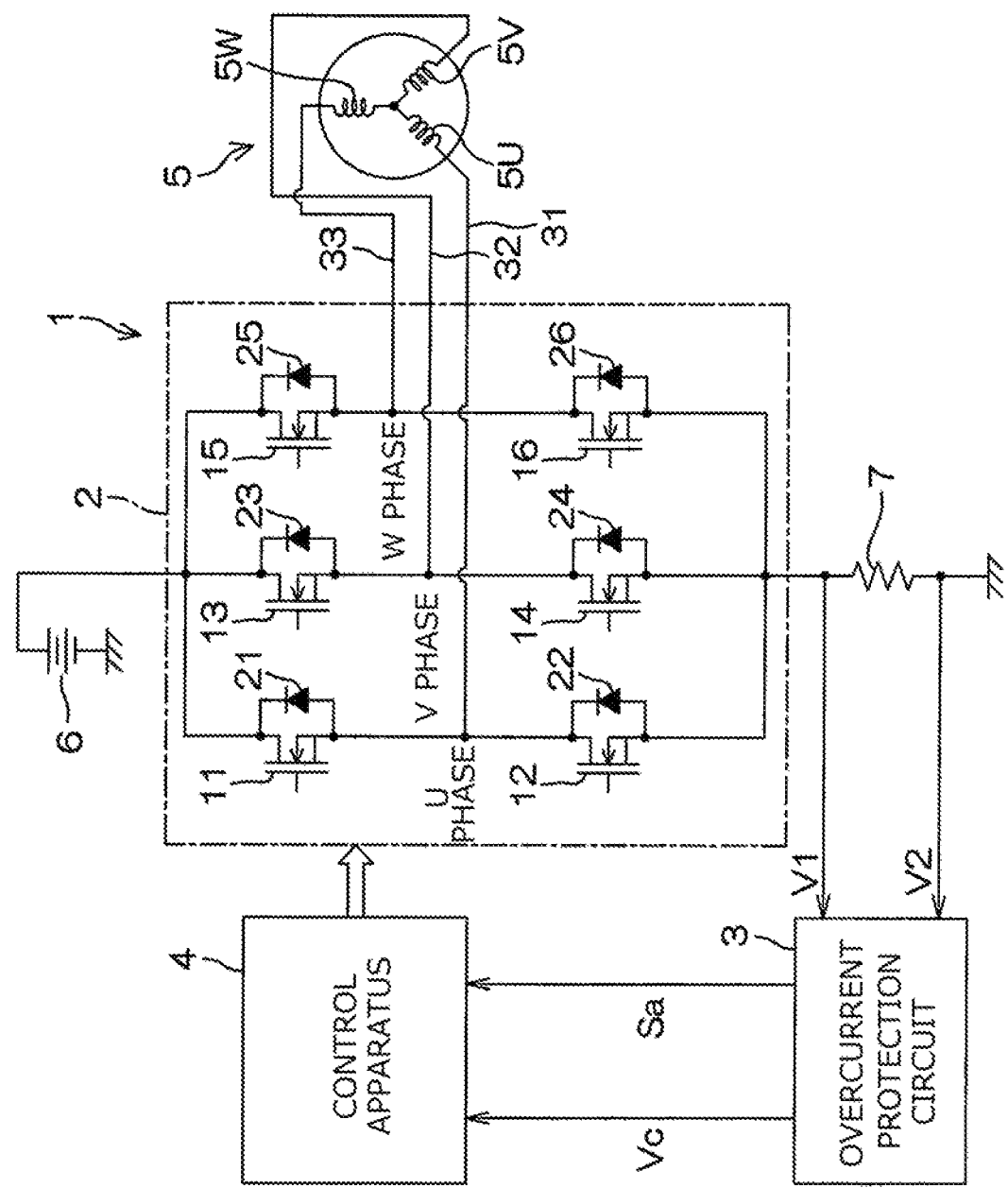
FIG. 1 is a schematic diagram illustrating a general configuration of a motor driving control apparatus including a three-phase inverter circuit to which an overcurrent protection circuit according to an embodiment of the invention is applied.

FIG. 1 is a schematic diagram illustrating a general configuration of a motor driving control apparatus including a three-phase inverter circuit to which an overcurrent protection circuit according to an embodiment of the invention is applied.

A motor driving control apparatus 1 includes a three-phase inverter circuit 2, an overcurrent protection circuit 3, and a control apparatus 4. The motor driving control apparatus 1 may be configured, for example, to controllably drive an electric motor for electric power steering systems.

The three-phase inverter circuit 2 supplies power to an electric motor 5 and is controlled by the control apparatus 4. The three-phase inverter circuit 2 includes a series circuit of a pair of switching elements 11, 12 corresponding to a U phase of the electric motor 5, a series circuit of a pair of switching elements 13, 14 corresponding to a V phase of the electric motor 5, and a series circuit of a pair of switching elements 15, 16 corresponding to a W phase of the electric motor 5. The series circuits are connected together in parallel between a positive terminal of a DC power supply 6 and ground. Regeneration diodes 21 to 26 are connected in parallel with the respective switching elements 11 to 16 in a direction in which a forward current flows from the ground toward the DC power supply 6. In the present embodiment, for example, n-channel field effect transistors (FETs) are used as the switching elements 11 to 16.

For the pair of switching elements in each phase, the switching element closer to the positive electrode of the DC power supply 6 may be referred to as an upper switching element, and the switching element closer to the ground may be referred to as a lower switching element. Drains of the upper switching elements 11, 13, 15 are connected to the DC power supply 6. Sources of the upper switching elements 11, 13, 15 are connected to the drains of the respective lower switching elements 12, 14, 16. Sources of the lower switching elements 12, 14, 16 are grounded. A shunt resistor 7 is connected between a connection point between the lower switching elements 12, 14, 16 and the ground.

A connection point between the pair of switching elements 11, 12 corresponding to the U phase is connected to a first end of a U-phase field winding 5U of the electric motor 5 via a U-phase power feed line 31. A connection point between the pair of switching elements 13, 14 corresponding to the V phase is connected to a first end of a V-phase field winding 5V of the electric motor 5 via a V-phase power feed line 32. A connection point between the pair of switching elements 15, 16 corresponding to the W phase is connected to a first end of a W-phase field winding 5W of the electric motor 5 via a W-phase power feed line 33. The second ends of the U-phase field winding 5U, the V-phase field winding 5V, and the W-phase field winding 5W are connected together.

When the motor driving control apparatus 1 (three-phase inverter circuit 2) starts operating, the control apparatus 4 generates and provides gate control signals for the switching elements 11 to 16 to gates of the respective switching elements 11 to 16. The control apparatus 4 has a function (fail safe function) to determine whether or not a failure has occurred in the switching elements 11 to 16 or in the three-phase inverter circuit 2 based on a through-current duration signal Vc from the overcurrent protection circuit 3 described below and to force all the switching elements 11 to 16 to be turned off upon determining that a failure has occurred. The control apparatus 4 further has a function (protection circuit check function) to check whether or not the overcurrent protection circuit 3 operates normally when the motor driving control apparatus 1 (three-phase inverter circuit 2) starts operating.

Figure 2:
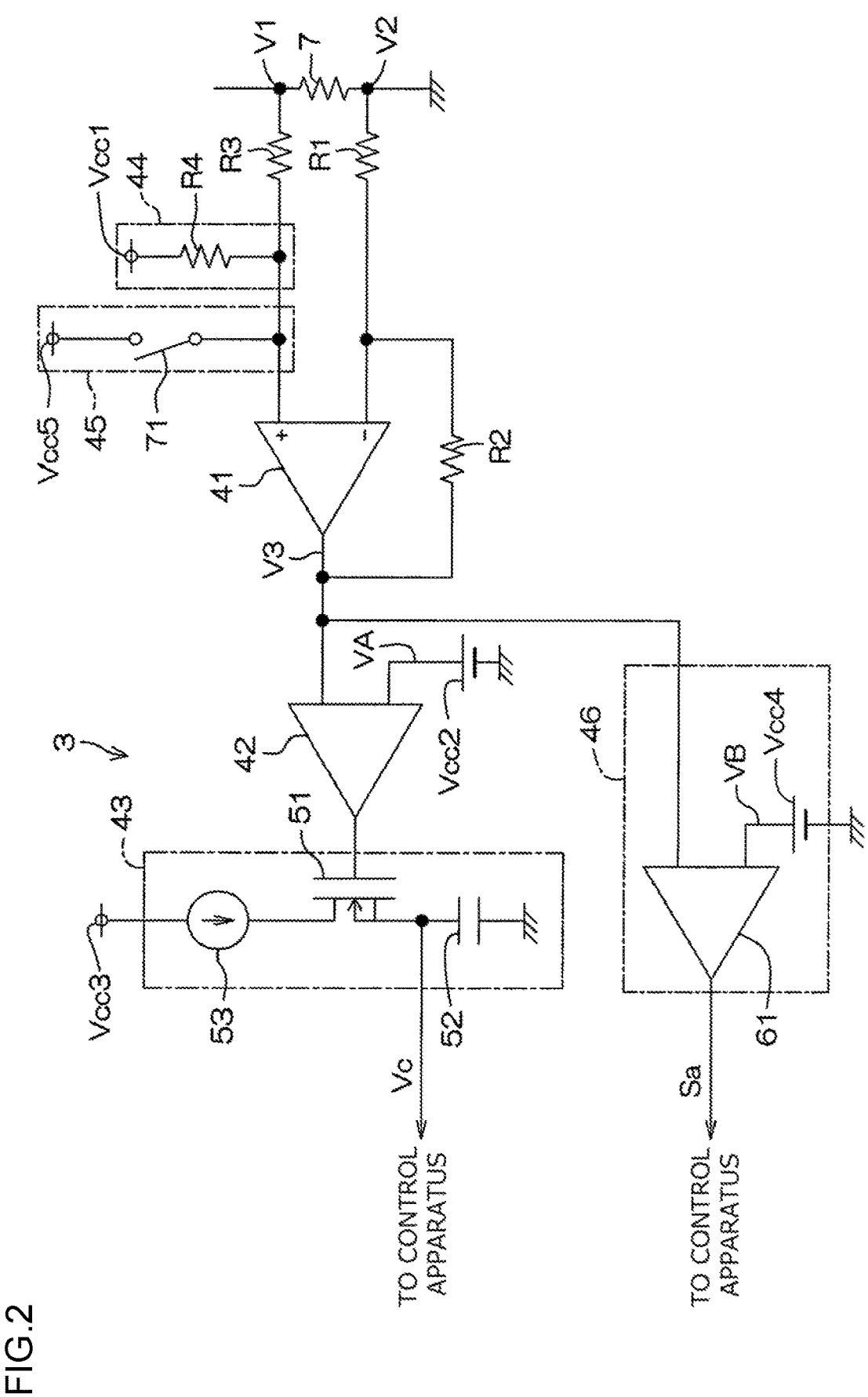
FIG. 2 is an electric circuit diagram illustrating the configuration of the overcurrent protection circuit.

FIG. 2 is an electric circuit diagram illustrating the configuration of the overcurrent protection circuit.

The overcurrent protection circuit 3 includes an amplifier (amplification circuit) 41, a first comparator (comparison circuit for through-current sensing) 42, a duration measurement circuit 43, an offset application circuit 44, a through-current simulation circuit 45, and an amplifier failure determination circuit 46.

The amplifier 41 is configured to amplify an inter-terminal voltage (V1-V2) of the shunt resistor 7. The shunt resistor 7 has a potential V1 at a power supply side terminal. The shunt resistor 7 has a potential V2 at a ground side terminal.

The amplifier 41 is an operational amplifier. A non-inverting input terminal (+) of the amplifier 41 is connected to the power supply side terminal of the shunt resistor 7 via a resistor R3. An inverting input terminal (−) of the amplifier 41 is connected to the ground side terminal of the shunt resistor 7 via a resistor R1. An output end of the amplifier 41 is connected to an inverting input terminal (−) of the amplifier 41 via a resistor R2.

The offset application circuit 44 is a circuit configured to allow the amplifier 41 to provide an output with a predetermined offset voltage VOFFSET additionally applied thereto. Specifically, the offset application circuit 44 includes a first DC power supply Vcc1, and a resistor R4 connected between the first DC power supply Vcc1 and the non-inverting input terminal (+) of the amplifier 41. The voltage (Vcc1) of the first DC power supply Vcc1 is, for example, 1.5 V.

For example, when R1=R3 and R2=R4, an output voltage V3 from the amplifier 41 is as expressed in the following equation (1).

$$V3=(R2/R3)\cdot(V1-V2)+Vcc1=(R2/R3)\cdot(V1-V2)+1.5 \qquad (1)$$

In this case, the offset voltage VOFFSET corresponds to Vcc1.

An output voltage V3 from the amplifier 41 is input to a first input terminal of the first comparator 42. A first reference voltage VA is input to a second input terminal of the first comparator 42 by a second DC power supply Vcc2. The first reference voltage VA is set to a value larger than the offset voltage VOFFSET by a predetermined value.

The first comparator 42 sets an output signal to an L level when the output voltage V3 from the amplifier 41 is lower than the first reference voltage VA and to an H level when the output voltage V3 from the amplifier 41 is higher than the first reference voltage VA. An H-level output signal may hereinafter be referred to as a through-current sensing signal.

The duration measurement circuit 43 is a circuit configured to measure a duration for which the through-current sensing signal is output from the first comparator 42. Specifically, the duration measurement circuit 43 includes a first switch 51, a capacitor 52, and a constant current source (a power supply for charging) 53. In the present embodiment, the first switch 51 is an n-channel type FET. A control terminal (gate electrode) of the first switch 51 is connected to an output terminal of the first comparator 42. The first switch 51 is controllably turned on and off by an output from the first comparator 42. The first switch 51 is normally off and is turned on when the through-current sensing signal is output from the first comparator 42.

The capacitor 52 includes a first electrode connected to a first terminal (source electrode) of the first switch 51. The capacitor 52 includes a second electrode that is grounded. The constant current source 53 is connected between a third DC power supply Vcc3 and a second terminal (drain electrode) of the first switch 51.

When the first switch 51 is turned on, a current from the constant current source 53 flows through the capacitor 52 via the first switch 51 to charge the capacitor 52. The voltage (an inter-terminal voltage Vc of the capacitor 52) at the connection point between the capacitor 52 and the first switch 51 is provided to the control apparatus 4 as the through-current duration signal Vc. The inter-terminal voltage Vc of the capacitor 52 is a voltage corresponding to the amount of charge with which the capacitor 52 is filled when the output voltage V3 from the amplifier 41 is higher than the first reference voltage VA. Therefore, the inter-terminal voltage Vc of the capacitor 52 has a value corresponding to a duration for which the through-current flows. Thus, the inter-terminal voltage Vc of the capacitor 52 is provided to the control apparatus 4 as the through-current duration signal Vc representing the duration for which the through-current flows.

The amplifier failure determination circuit 46 is a circuit configured to determine whether or not a low fixing failure has occurred in the amplifier 41. The low fixing failure in the amplifier 41 refers to a failure in which the output from the amplifier 41 is fixed to a low level (ground level).

The amplifier failure determination circuit 46 includes a second comparator 61. The output voltage V3 from the amplifier 41 is input to a first input terminal of the second comparator 61. A second reference voltage VB is input to a second input terminal of the second comparator 61 by a fourth DC power supply Vcc4. The second reference voltage VB is set to a value (for example, 1.0 V) that is larger than zero and smaller than the offset voltage VOFFSET. The second comparator 61 compares the output voltage V3 from the amplifier 41 with the second reference voltage VB to output an amplifier failure determination signal Sa corresponding to the result of the comparison.

The through-current simulation circuit 45 is a circuit configured to force the amplifier 41 to output a voltage higher than the first reference voltage VA at any timing. In other words, the through-current simulation circuit 45 is a circuit configured to generate, in a simulated manner, a state in which the through-current flows. Specifically, the through-current simulation circuit 45 includes a second switch 71 connected between a fifth DC power supply Vcc5 and the non-inverting input terminal (+) of the amplifier 41. The voltage (Vcc5) of the fifth DC power supply Vcc5 is set to a voltage (for example, 5 V) higher than the first reference voltage VA. The second switch 71 is controlled by the control apparatus 4. The second switch 71 may be configured using an FET.

When the second switch 71 is on, the output voltage V3 from the amplifier 41 is approximately equal to Vcc5 (in this example, 5 V).

When the motor driving control apparatus 1 starts operating, the control apparatus 4 generates and provides gate control signals for the switching elements 11 to 16 to the gates of the respective switching elements 11 to 16. The control apparatus 4 monitors the through-current duration signal Vc from the overcurrent protection circuit 3 to determine whether or not a failure has occurred in the switching elements 11 to 16 or in the three-phase inverter circuit 2 (whether or not a through-current abnormality has occurred). Upon determining that a failure has occurred, the control apparatus 4 forces all the switching elements 11 to 16 to be turned off.

Specifically, the control apparatus 4 compares a predetermined threshold α with the through-current duration signal Vc provided by the overcurrent protection circuit 3. When the through-current duration signal Vc is larger than the threshold α, in other words, when the duration when the through-current flows is longer than a predetermined time corresponding to the threshold α, the control apparatus 4 forces all the switching elements 11 to 16 to be turned off. The control apparatus 4 forces all the switching elements 11 to 16 to be turned off, for example, by grounding the gates of all the switching elements 11 to 16.

A protection circuit check function of the control apparatus 4 will be described. The control apparatus 4 checks whether or not the overcurrent protection circuit 3 operates normally when the motor driving control apparatus 1 starts operating.

Check items are as described below.
(1) A high fixing failure in the amplifier 41: a failure in which the output from the amplifier 41 is fixed to the H level.
(2) A low fixing failure in the amplifier 41: a failure in which the output from the amplifier 41 is fixed to the L level (ground level).
(3) A high fixing failure in the first comparator 42: a failure in which the output from the comparator 42 is fixed to the H level.
(4) A low fixing failure in the first comparator 42: a failure in which the output from the comparator 42 is fixed to the L level (ground level).
(5) A short-circuit failure in the first switch 51: a failure in which the switch 51 is normally on.
(6) An open-circuit failure in the first switch 51: a failure in which the switch 51 is normally off.
(7) A short-circuit failure in the capacitor 52: a failure in which the capacitor 52 is short-circuited.

If a high fixing failure in the amplifier 41 (item (1)), a high fixing failure in the first comparator 42 (item (3)), or a short-circuit failure in the first switch 51 (item (5)) has occurred, the capacitor 52 is charged in spite of the lack of flow of the through-current. Thus, a through-current abnormality is detected. If the through-current abnormality is detected when the motor driving control apparatus 1 (three-phase inverter circuit 2) starts operating, the control apparatus 4 gives an alarm to inform an operator that a high fixing failure in the amplifier 41, a high fixing failure in the first comparator 42, or a short-circuit failure in the first switch 51 is likely to have occurred.

If a low fixing failure in the amplifier 41 (item (2)) has occurred, the through-current sensing signal fails to be output from the first comparator 42 even if the through-current flows during operation of the three-phase inverter circuit 2. This precludes the through-current abnormality from being detected. Thus, when the motor driving control apparatus 1 starts operating, the control apparatus 4 determines whether or not a low fixing failure in the amplifier 41 has occurred in the amplifier 41 based on the amplifier failure determination signal Sa that is the output from the second comparator 61.

Since the output voltage V3 from the amplifier 41 is equal to or higher than the offset voltage VOFFSET (in this example, equal to or higher than 1.5 V), the output voltage V3 from the amplifier 41 is higher than the second reference voltage VB (in this example, 1.0 V) if no low fixing failure has occurred in the amplifier 41. Thus, if no low fixing failure has occurred in the amplifier 41, the amplifier failure determination signal Sa is at the H level. On the other hand, if a low fixing failure has occurred in the amplifier 41, the output voltage V3 from the amplifier 41 is lower than the second reference voltage VB (in this example, 1.0 V). Thus, if a low fixing failure has occurred in the amplifier 41, the amplifier failure determination signal Sa is at the L level. If the amplifier failure determination signal Sa is at the L level when the motor driving control apparatus 1 starts operating, the control apparatus 4, for example, gives an alarm to inform the operator that a low fixing failure has occurred in the amplifier 41 for electric power steering systems.

If a low fixing failure in the first comparator 42 (item (4)), an open-circuit failure in the first switch 51 (item (6)), or a short-circuit failure in the capacitor 52 (item (7)) has occurred, no charge is accumulated in the capacitor 52 even when the through-current flows during operation of the three-phase inverter circuit 2. This precludes the through-current abnormality from being detected. Thus, when the motor driving control apparatus 1 starts operating, the control apparatus 4 temporarily turns on the second switch 71 for a predetermined period or more to determine whether or not the through-current duration signal Vc is larger than the threshold α. The predetermined time is set to a time sufficient to make the inter-terminal voltage (through-current duration signal) Vc of the capacitor 52 higher than the threshold α if no failure has occurred in the relevant units of the overcurrent protection circuit 3. When the second switch 71 is kept on for a predetermined time or longer and the through-current duration signal Vc nevertheless fails to be larger than the threshold α, the control apparatus 4, for example, gives an alarm to inform the operator that a low fixing failure in the first comparator 42, an open-circuit failure in the first switch 51, or a short-circuit failure in the capacitor 52 is likely to have occurred for electric power systems.

In the above-described embodiment, the invention is applied to the three-phase inverter circuit. However, the invention is applicable to any electronic circuits other than the three-phase inverter circuit so long as the electronic circuit includes at least one series circuit of an upper switching element and a lower switching element. Various changes may be made within the scope of matters recited in claims.

What is claimed is:

1. An overcurrent protection circuit that is applied to an electronic circuit including at least one series circuit of an upper switching element and a lower switching element, the overcurrent protection circuit comprising:
   an amplification circuit configured to amplify an inter-terminal voltage of a shunt resistor for through-current detection;
   an offset application circuit connected to an input terminal of the amplification circuit to allow the amplification circuit to provide an output with a predetermined offset voltage additionally applied thereto;
   a comparison circuit for through-current sensing that compares an output voltage from the amplification circuit with a predetermined first reference voltage higher than the offset voltage to output a through-current sensing signal when the output voltage from the amplification circuit is higher than the first reference voltage, the through-current sensing signal being a first output;
   a duration measurement circuit configured to measure a duration for which a through-current sensing signal is output from the comparison circuit for through-current sensing; and
   an amplification circuit failure determination circuit that compares the output voltage from the amplification circuit with a predetermined second reference voltage that is higher than zero and lower than the offset voltage to output an amplification circuit failure determination signal corresponding to a result of the comparison, the amplification circuit failure determination signal being a second output,
wherein the first output and the second output have different voltages.

2. An overcurrent protection circuit that is applied to an electronic circuit including at least one series circuit of an upper switching element and a lower switching element, the overcurrent protection circuit comprising:
   an amplification circuit configured to amplify an inter-terminal voltage of a shunt resistor for through-current detection;
   an offset application circuit connected to an input terminal of the amplification circuit to allow the amplification circuit to provide an output with a predetermined offset voltage additionally applied thereto;
   a comparison circuit for through-current sensing that compares an output voltage from the amplification circuit with a predetermined first reference voltage higher than the offset voltage to output a through-current sensing signal when the output voltage from the amplification circuit is higher than the first reference voltage;
   a duration measurement circuit configured to measure a duration for which a through-current sensing signal is output from the comparison circuit for through-current sensing, the duration measurement circuit including:
      a first switch configured to be normally off and to be turned on when the through-current sensing signal is output from the comparison circuit for through-current sensing;
      a capacitor having a first electrode connected to a first terminal of the first switch and a second electrode that is grounded; and
      a power supply for charging connected to a second terminal of the first switch to charge the capacitor, the duration measurement circuit being configured to output an inter-terminal voltage of the capacitor; and
   an amplification circuit failure determination circuit that compares the output voltage from the amplification circuit with a predetermined second reference voltage that is higher than zero and lower than the offset voltage to output an amplification circuit failure determination signal corresponding to a result of the comparison.

3. An overcurrent protection circuit that is applied to an electronic circuit including at least one series circuit of an upper switching element and a lower switching element, the overcurrent protection circuit comprising:
   an amplification circuit configured to amplify an inter-terminal voltage of a shunt resistor for through-current detection;
   an offset application circuit connected to an input terminal of the amplification circuit to allow the amplification circuit to provide an output with a predetermined offset voltage additionally applied thereto;
   a comparison circuit for through-current sensing that compares an output voltage from the amplification circuit with a predetermined first reference voltage higher than the offset voltage to output a through-current sensing signal when the output voltage from the amplification circuit is higher than the first reference voltage;
   a duration measurement circuit configured to measure a duration for which a through-current sensing signal is output from the comparison circuit for through-current sensing;
   an amplification circuit failure determination circuit that compares the output voltage from the amplification circuit with a predetermined second reference voltage that is higher than zero and lower than the offset voltage to output an amplification circuit failure determination signal corresponding to a result of the comparison; and
a through-current simulation circuit configured to force the amplification circuit to output a voltage higher than the first reference voltage at any timing,
wherein the through-current simulation circuit includes a second switch connected between a predetermined DC power supply and an input terminal of the amplification circuit.

* * * * *